United States Patent
Tsai et al.

[11] Patent Number: 5,866,462
[45] Date of Patent: Feb. 2, 1999

[54] DOUBLE-SPACER TECHNIQUE FOR FORMING A BIPOLAR TRANSISTOR WITH A VERY NARROW EMITTER

[75] Inventors: Curtis Tsai, Beaverton, Oreg.; Kenneth K. O, Gainesville, Fla.; Brad W. Scharf, Winchester, Mass.

[73] Assignee: Analog Devices, Incorporated, Norwood, Mass.

[21] Appl. No.: 536,338

[22] Filed: Sep. 29, 1995

[51] Int. Cl.$^6$ ................................................ H01L 21/331
[52] U.S. Cl. ..................... 438/366; 438/368; 438/309
[58] Field of Search ................................... 438/366, 365, 438/368, 309, 322, 364

[56] References Cited

U.S. PATENT DOCUMENTS

| | | | |
|---|---|---|---|
| 4,581,319 | 4/1986 | Wieder et al. | 438/366 |
| 5,023,192 | 6/1991 | Josquin et al. | 438/366 |
| 5,424,228 | 6/1995 | Imai | 438/366 |
| 5,512,785 | 4/1996 | Haver et al. | 257/758 |

*Primary Examiner*—Tuan H. Nguyen
*Attorney, Agent, or Firm*—Parmelee & Bollinger LLP

[57] ABSTRACT

Emitter widths of 0.3 $\mu$m on double polysilicon bipolar transistors are achieved using 0.8 $\mu$m photolithography and a double spacer process. The emitter width reduction is confirmed with structural and electrical measurements. The double-spacer device exhibits superior low current $f_T$ and $f_{max}$.

5 Claims, 2 Drawing Sheets

DOUBLE-SPACER TECHNIQUE FOR FORMING A BIPOLAR TRANSISTOR WITH A VERY NARROW EMITTER

BACKGROUND OF THE INVENTION

Devices for consumer wireless applications require low power and low cost while maintaining sufficient RF performance. Double-polysilicon bipolar processes for RF applications have been demonstrated. Other recently published work has shown that improvements in low power performance can be achieved by scaling the emitter width. Scaling the emitter width provides an additional degree of freedom in the design of low power, low noise amplifiers (LNAs). The noise figure (N.F.) of a LNA is constrained by the transistor base resistance. Typically, a minimum width transistor is chosen and the length is increased until the base resistance drops sufficiently to meet the N.F. specification. Unfortunately low power operation fixes the maximum collector current, so lengthening the transistor decreases collector current density which causes $f_T$ and $f_{max}$ drop. A narrower emitter reduces the intrinsic portion of base resistance, hence a shorter emitter length is needed to meet the N.F. specification. The shorter emitter length results in higher $f_T$ and $f_{max}$ at a given collector current.

For the double-polysilicon transistor structure, the emitter width can be reduced by increasing the spacer width. Introducing a wider spacer, however, increases the separation between the emitter and the base polysilicon and requires additional process optimization. A longer extrinsic base drive is needed to address the increase in base link resistance while simultaneously avoiding low breakdown voltage or the increase in emitter-base tunneling current. In addition to disturbing the details of the emitter-base junction, forming a wider spacer involves significant re-optimization of the deposition thickness and etch selectivity of the layers forming the composite spacer. Another conventional method of emitter scaling involves improving the photolithographic tools to print smaller geometries. This path, however, incurs additional equipment cost.

SUMMARY OF THE INVENTION

In a preferred embodiment of this invention, the emitter width is scaled by incorporating an additional spacer into an existing single-spacer process. This "double-spacer" technology provides a simple method of achieving deep submicron emitter widths without significantly upsetting the details of the existing emitter-base junction or upgrading photolithographic tools. This technology provides a possibility of scaling to dimensions below 0.3 µm. The device parameters $\beta_F$, $BV_{CEO}$, $V_A$ of transistors with the additional spacer are not compromised significantly, yet improvements in the low power $f_T$ and $f_{max}$ are achieved.

DETAILED DESCRIPTION OF A PREFERRED EMBODIMENT OF THE INVENTION

The relevant steps of the composite spacer process flow for a presently preferred embodiment of the invention are summarized in Table 1. This table primarily describes the single spacer process, while introducing the double-spacer process in Step 2a.

TABLE 1

Process flow of relevant steps

| Step | Process Description |
| --- | --- |
| 1 | pattern 0.8 µm emitter opening over LTO/poly |
| 2 | plasma etch LTO |
| 2a | form additional nitride or TEOS spacer |
| 3 | plasma etch base handle poly |
| 4 | form composite TEOS/nitride spacer |
| 5 | deposit and pattern emitter polysilicon |

In Step 1, a minimum drawn emitter width of 0.8 µm is patterned over a stack of low temperature oxide (LTO) and polysilicon. Next, an oxide plasma etch removes the LTO and stops on the underlying polysilicon. The photoresist is stripped leaving the cross section shown in FIG. 1a. A polysilicon plasma etch in step 3 defines the emitter opening prior to composite spacer formation in Step 4. A thin thermal oxide is grown to heal the surface damage and phosphorus ions are implanted to form a selectively implanted collector (SIC).

Figure 2A:
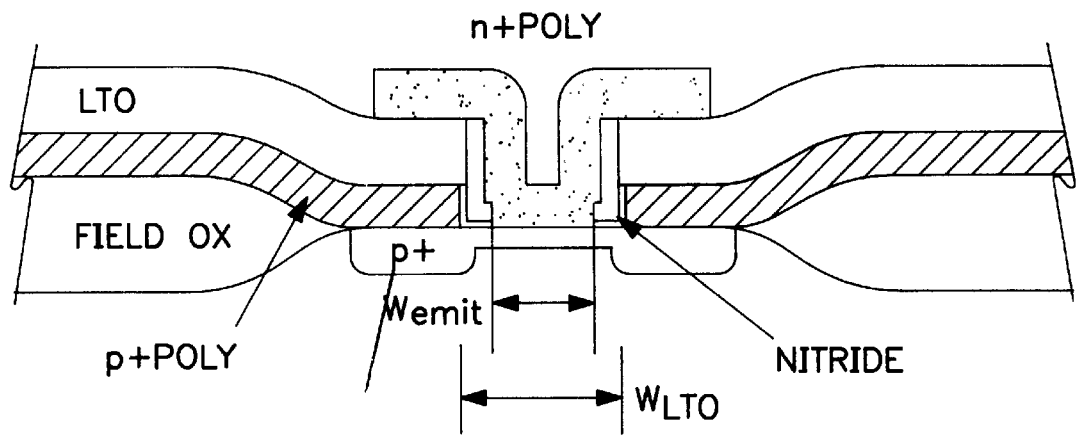
FIG. 2a is a cross-section of a single-spacer device after emitter poly.

The thermal oxide is stripped and another thin thermal oxide is grown. After the intrinsic base implant, LPCVD nitride and TEOS are deposited. Sacrificial TEOS spacers are formed using an anisotropic etch that stops on the nitride. The TEOS spacers mask a subsequent low power plasma etch that removes the nitride in emitter opening and over the field. Next, the sacrificial TEOS spacers and thin thermal oxide in the active device region are removed with an HF dip prior to emitter polysilicon deposition leaving a single L-shaped nitride spacer. A drawing of the device cross section after the emitter polysilicon deposition and patterning is shown in FIG. 2a. The resulting structural emitter width is about 0.5 µm.

Figure 1A:
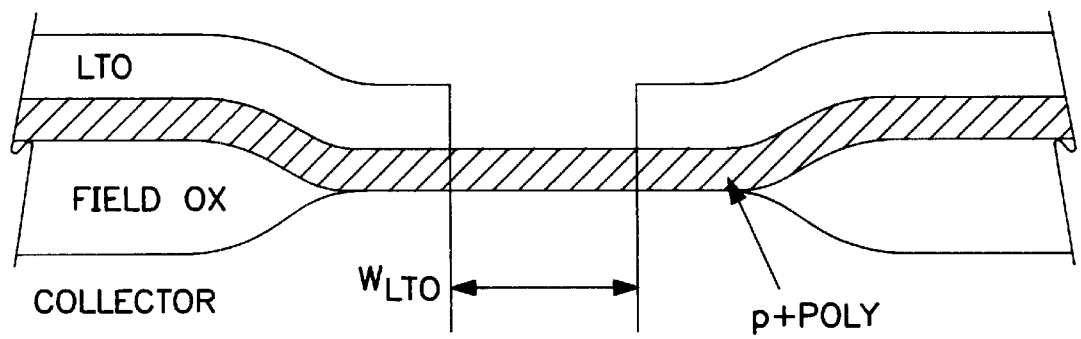
FIG. 1a is a cross-section of a single-spacer device showing the emitter opening after the LTO etch.
Figure 1B:
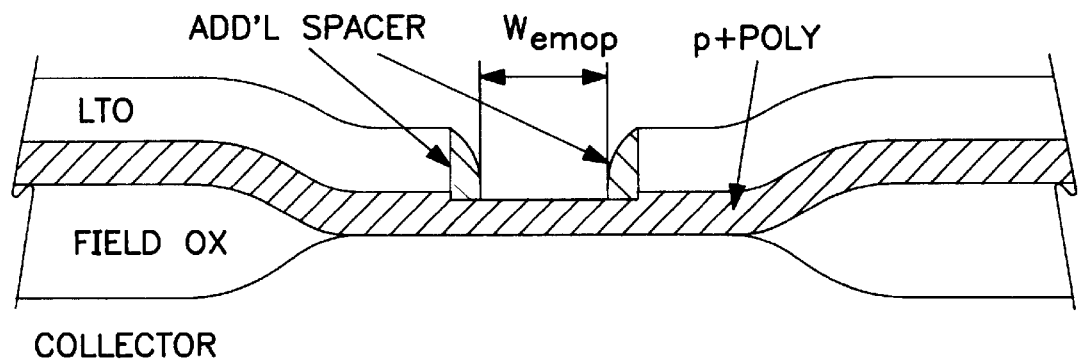
FIG. 1b is a cross-section of a double-spacer device showing the emitter opening after the LTO etch.
Figure 2B:
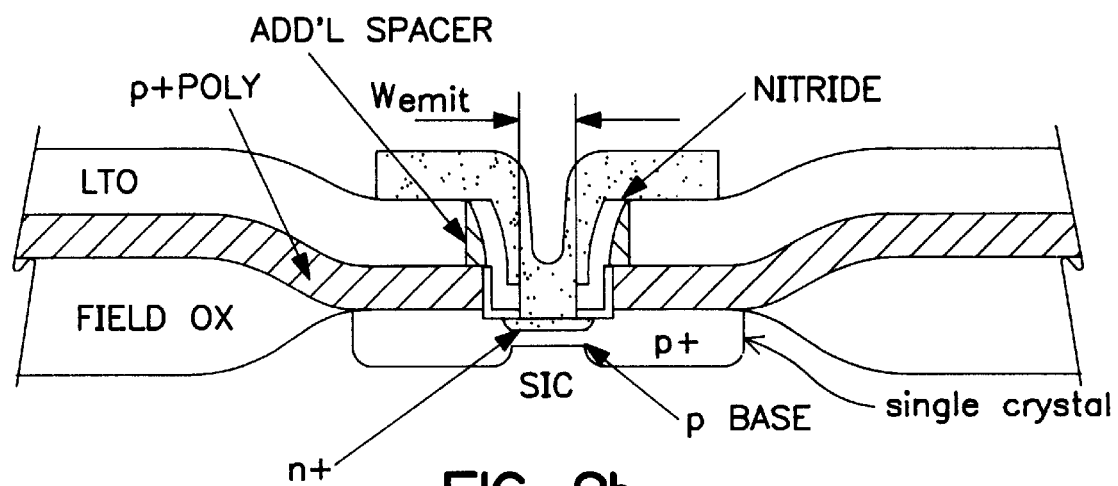
FIG. 2b is a cross-section of a double-spacer device after emitter poly.

Modification of this single-spacer process to achieve a 0.3 µm structural emitter width involves inserting an additional spacer immediately after the plasma LTO etch and photoresist strip (Step 2a in Table 1). Specifically, an additional TEOS or LPCVD nitride layer is deposited after etching the LTO. FIG. 1b shows the additional spacer after an anisotropic etch of the TEOS or nitride layer that stops on the underlying polysilicon. The additional spacer masks the subsequent polysilicon emitter opening etch and reduces the emitter opening width. Subsequent process steps to form the composite spacer follow the same flow described in the previous paragraph. The final drawn cross section for the double-spacer process is shown in FIG. 2b.

Because the TEOS/nitride composite spacer formation steps have not changed, the extrinsic base to polysilicon emitter separation is the same for both processes. However, the polysilicon emitter width and commensurate intrinsic base region have been narrowed by the additional spacer. Furthermore, the base p+ polysilicon-to-single-crystal contact area increases, thus the contact resistance portion of the total base resistance decreases. In FIGS. 1a and 2a, $W_{lto}$ defines the emitter opening after the LTO etch. In FIG. 1b, $W_{emop}$ defines the emitter opening width after the polysilicon etch but prior to spacer formation. In FIGS. 2a and 2b, $W_{emit}$ defines the width of the polysilicon emitter contact to the single-crystal. The total spacer width on one side,= $(W_{lto}-W_{emit})/2$. The difference in that total spacer width with and without an additional spacer can be defined as=$\Delta W_{emop}/2$=$\Delta W_{emit}/2$.

As described above, a significant step in the formation of double-poly bipolar transistors results from the anisotropic etching of an emitter opening through sequential layers of dielectric and extrinsic-base polysilicon to underlying monocrystalline silicon. A dielectric spacer is formed inside the perimeter of this emitter opening to reduce its area before emitter polysilicon is deposited. In a preferred embodiment of the preferred invention, the anisotropic etching of the emitter opening is separated into 3 stages: (1) dielectric etch down to base-poly, (2) formation of a side-wall spacer inside the dielectric window, and (3) etching the emitter opening in the base-poly using the spacer as an etch mask to reduce the opening size relative the size of the opening formed in the dielectric above it. The size of emitter opening at the surface of the single-crystal silicon, where the active emitter is to be formed, is smaller than the minimum opening determined by photolithographic constraints as in the case of the conventional double-poly bipolar process.

The double-spacer process described above can achieve 0.3 $\mu$m emitter widths in an existing 0.8 $\mu$m double-polysilicon npn bipolar transistor process. A costly upgrade of the photolithography tools is supplanted by an easily integrated additional spacer formed by depositing either a TEOS or nitride layer followed by an anisotropic etch. Using a 165-nm TEOS layer for an additional spacer reduces the final emitter width from 0.5 to 0.3 $\mu$m. Further scaling below 0.3 $\mu$m is possible by depositing thicker layers for wider additional spacers while retaining the existing single-spacer flow. Thus additional process development is minimized for future scaling. Because the details of the emitter-base junction are unchanged, only slight differences in the current gain, breakdown voltage and Early voltage were observed by inserting the additional spacer. Savings of 15 to 25% in collector current, and hence power, required to reach a given $f_{max}$ and $f_T$ are obtained with the double-spacer process.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In a process for forming a double-polysilicon, self-aligned (DPSA) bipolar transistor having a collector, base and emitter, wherein a substrate is formed with a layer of base-contact polysilicon and a layer of dielectric thereabove, the method comprising the steps of:

etching a first opening through said dielectric layer with the etch stopping at said polysilicon layer;

establishing a first dielectric spacer in said first opening closely adjacent the side walls of said dielectric layer;

etching said base-contact polysilicon layer through the opening defined by said first spacer to form an emitter opening through said polysilicon layer;

forming in said emitter opening a second dielectric spacer closely adjacent the side walls of said polysilicon layer and extending up to and alongside said first spacer; and applying polysilicon through said emitter opening to establish contact with an emitter region in said substrate;

said first and second spacers cooperating to define a reduced-width emitter area.

2. The method of claim 1, wherein said substrate is single-crystal silicon.

3. The method of claim 1, wherein said dielectric is an oxide layer.

4. The method of claim 1, wherein said substrate is formed with a base beneath said emitter and a collector beneath said base.

5. The method of claim 4, wherein said base is surrounded by a further correspondingly doped region.

* * * * *